United States Patent [19]

Murphy

[11] Patent Number: 4,979,075
[45] Date of Patent: Dec. 18, 1990

[54] METHOD AND APPARATUS FOR CONTROLLING CIRCUIT EXPANSION FOR CONSUMER ELECTRONIC SYSTEMS

[75] Inventor: Preston J. Murphy, Austin, Tex.

[73] Assignee: Compuadd, Corporation, Austin, Tex.

[21] Appl. No.: 420,169

[22] Filed: Oct. 12, 1989

[51] Int. Cl.⁵ ............................................. H05K 1/14
[52] U.S. Cl. .................................. 361/399; 29/830; 361/413; 361/417; 361/420; 361/427
[58] Field of Search .................................. 29/830–832; 361/380, 394, 395, 399, 412, 413, 415, 417, 419, 420, 427

[56] References Cited

U.S. PATENT DOCUMENTS

| | | | |
|---|---|---|---|
| 4,744,006 | 5/1988 | Duffield | 361/413 |
| 4,745,524 | 5/1988 | Patton, III | 361/413 |

*Primary Examiner*—Gregory D. Thompson
*Attorney, Agent, or Firm*—Baker & Botts

[57] ABSTRACT

There is disclosed a system and method for allowing user to add circuit boards to a closed housing electrical system. The system relies upon a circuit board carrier which plugs into a connector permanently mounted within the housing. The carrier is fully removable from the system housing and has a support bracket for suspending a vertical partition, the bottom edge of which mates mechanically and electrically with the permanently mounted connector. Both sides of the partition support a plurality of edgewise connectors, stacked one over the other, for accepting the plug-in expansion circuit boards. The vertical partition connectors are electrically connected to the permanently mounted connector such that when the carrier is in position within the housing all of the mated expansion boards are electrically operable and connected to the existing system.

16 Claims, 4 Drawing Sheets

METHOD AND APPARATUS FOR CONTROLLING CIRCUIT EXPANSION FOR CONSUMER ELECTRONIC SYSTEMS

TECHNICAL FIELD OF THE INVENTION

This invention relates to a method and system for allowing a consumer to add circuit boards to a closed box electronic system and more particularly to such a system and method for use in a horizontally mounted printed wiring board system.

BACKGROUND OF THE INVENTION

In certain closed box electronic systems it has become common practice for the consumer to open the box and add printed wiring boards or other devices to the existing wiring boards. Such additions are not always easy, even for trained service personnel. When untrained consumers attempt such operations many problems can result. One such problem, of course, is the always present danger of electrical shock or accidental miswiring resulting in a fire or other mishap.

As the box which houses the electronic circuitry becomes reduced in size the tolerance for error becomes even less and thus the potential for serious problems increases. In addition, since the amount of available room within the box is severely limited, it is often impossible for a consumer to add additional expansion boards without first removing many of the bulky parts from the housing. In desk top computers these bulky parts are typically power supplies and disk drives, two component types which are difficult to remove and frought with trouble unless reconnected properly.

A related problem, but one which arises in a different context, is the ability of the equipment manufacturer to remove the basic electronics from the housing for repair or servicing. When a number of extra boards have been added, the time necessary to remove them all adds considerably to the repair cost. An alternative would be for the manufacturer to build all of the electronic functions on a single board. This approach, however, would result in higher initial costs and a reduced ability to tailor a system specifically to a consumer's requirements.

Thus, a need exists in the art for an arrangement which allows many add-on electronic boards to be inserted into, or removed from, a closed electronics system housing with a minimum of effort and with a minimum of possible error.

It is also desirous to arrange such a system such that add-on boards can be removed easily thereby allowing access to the main electronic components.

It is also a desired result to allow for the easy addition and removal of such add-on boards packed in a high density while also providing for rigid support of the boards.

SUMMARY OF THE INVENTION

A method and a support system have been devised which allow for the addition of several expansion or add-on printed wiring boards within the housing of an electronic package. This has been accomplished by mounting the basic electronic circuitry on a permanent board and then mounting that board flat, or horizontal within the housing. The permanent board has a connector mounted on its top surface with its open end facing upward. Inserted into the connector is a carrier having a group of horizontally displaced connectors mounted thereon. These connectors, in one embodiment, are arranged back-to-back on either side of a partition circuit so that add-on boards can be inserted into the connectors on both sides of the carrier partition.

The partition connectors are displaced above each other, on each side of the partition, so that several layers of horizontally positioned add-on boards can be inserted into the connectors, one above the other.

The carrier is in the form of a T lying horizontal with the partition extending downward from the bottom leg of the T. The end of the bottom leg is held in place by the top surface of the front of the housing, while the top bar of the T is held in position by attachment to the rear of the housing. In one embodiment, long add-on boards pass entirely across the inside of the housing, from back to front in a horizontal plane, and are adapted to be supported along their front edges by a support mounted in conjunction with the front surface of the housing. Other boards are mounted on the other side of the partition, also from back to front in the horizontal plane.

The entire carrier is designed to be removed easily from the housing by first removing a few fasteners. The entire carrier is lifted from the housing, bringing with it all of the add-on boards which have been previously inserted therein.

It is thus a technical advantage that while each add-on board is inserted into the carrier individually in a horizontal plane, they are all removable from the main board connector by one upward vertical movement. This creates an add-on board carrier which is then easily insertable or removable as a complete unit. Individual add-on boards can be added to the carrier, either while the carrier is out of the housing or while it is in place inside the housing.

BRIEF DESCRIPTION OF THE DRAWINGS

For a more complete understanding of the present invention, and further advantages thereof, reference is now made to the following detailed description taken in conjunction with accompanying drawings in which.

DETAILED DESCRIPTION OF THE INVENTION

Figure 1:
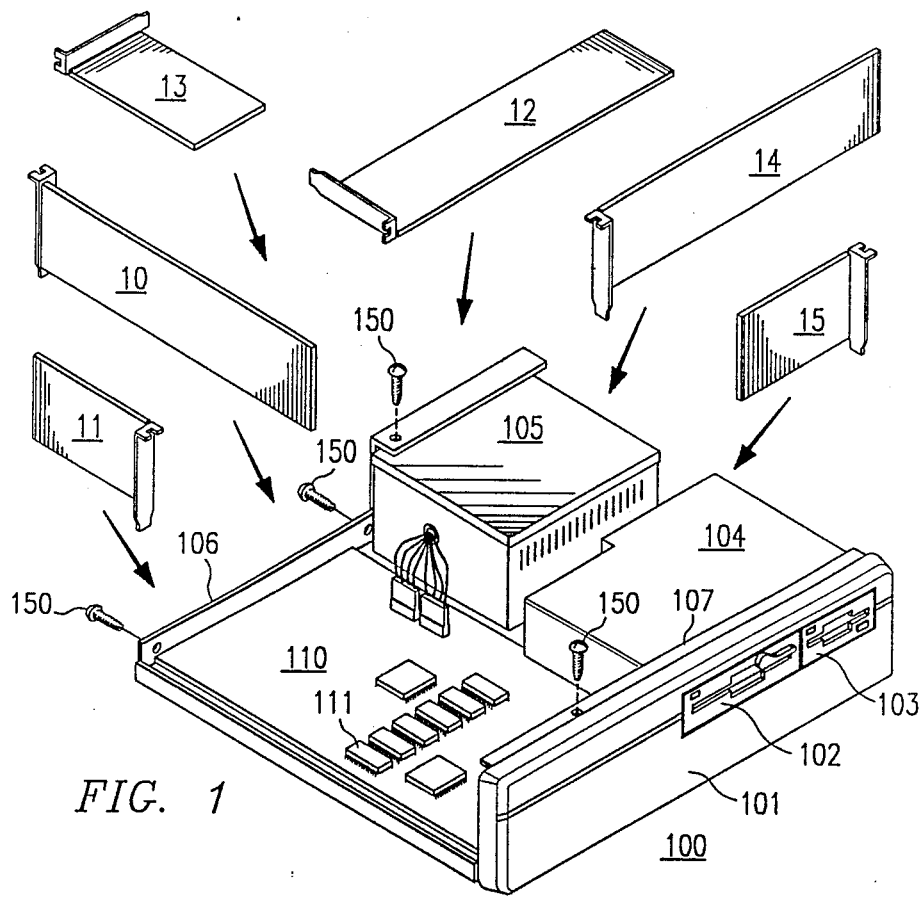
FIG. 1 shows a system with a cover off and several extra add-on circuit boards which are to be fitted inside.

FIG. 1 illustrates the problem. Computer system 100 is shown with a permanently mounted electronic board 110. It is desired to fit several extra expansion boards 10, 11, 12, 13, 14 and 15 into the system without removing the major components.

Computer system 100 has its top cover off (not shown) and has a front plate 101 having two disc drive slots, 102, 103. Behind front plate 101 is disc drive unit 104, and power supply 105. Electronic board 110 having components 111 mounted thereon is mounted inside the system.

The problem is further compounded when it is realized that the height of computer system 100, from the top of board 110 to the top of front cover 101, can be, and usually is, less than the height of any one of the boards 10 through 15.

Figure 2:
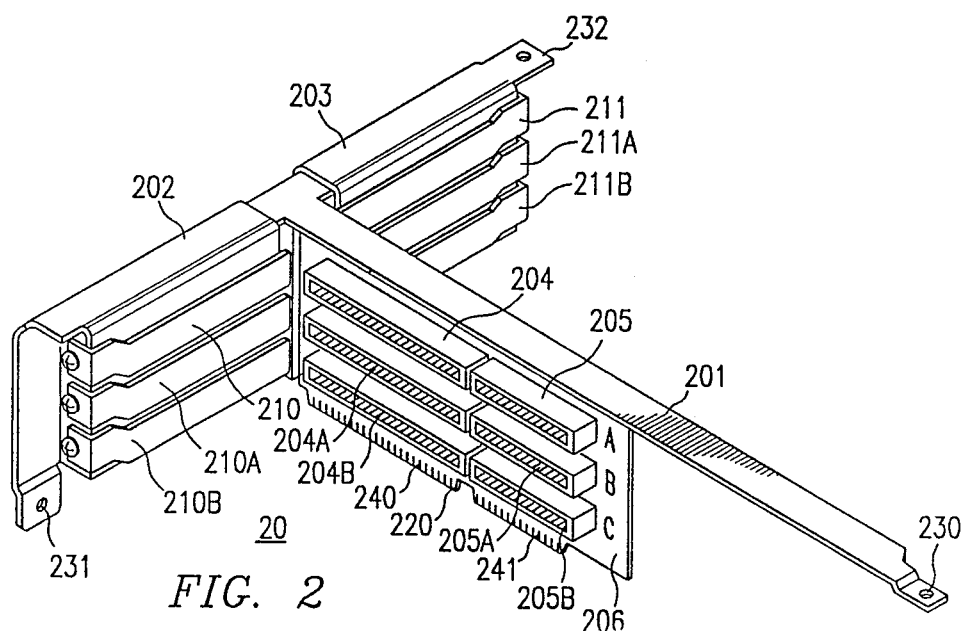
FIG. 2 shows a carrier of the present invention.
Figure 8:
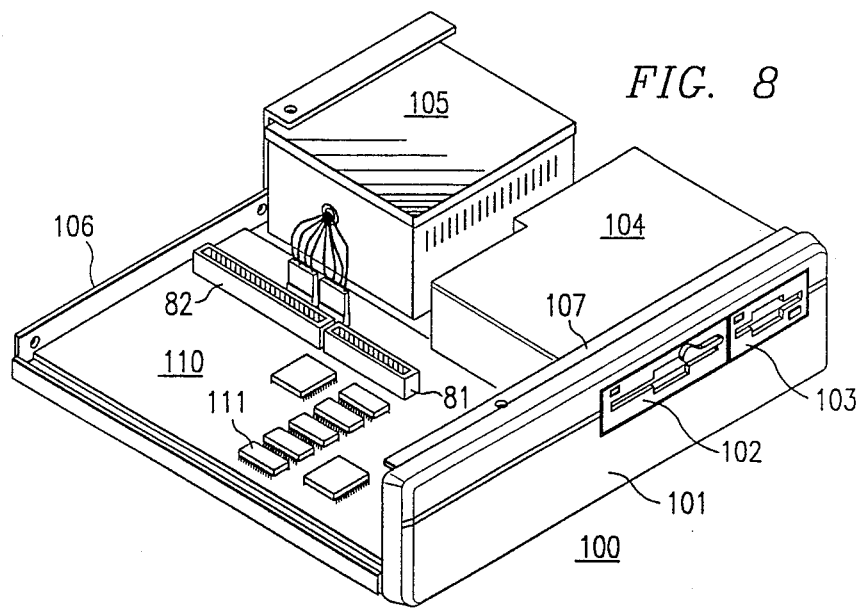
FIG. 8 shows the permanently mounted circuit board with a connector for accepting a carrier.

FIG. 2 shows carrier 20 which, as will be seen, plugs into board 110 and which can be completely removed from the system by simply removing four holding screws 150 (FIG. 1) and unplugging the carrier 20. Board 110 is fitted with a connector, such as connector 81, 82, as shown in FIG. 8. Connector 81, 82 is arranged to receive in mating relationship the connector end 240, 241 of board 206 which board extends downward from bracket 201 of carrier 20. Thus, when carrier 20 is inserted into computer system 100, connector end 240 and 241 plug into 82 and 81, (FIG. 8). The electrical contacts are electrically connected, in turn, to the electrical terminals of connectors 204, 205, 204A, 205A, 204B and 205B using appropriate circuitry.

The same type of connector arrangement (not shown) is on the opposite side of vertical board 206. Vertical board 206 acts as a partition and is supported at the top by bracket 201 and at the rear end by bracket 202, 203.

Rear bracket 202, 203 supports six blank cover plates 210, 210A, 210B, 211, 211, 211B. When no expansion or plug-in boards are in the system, these plates are all positioned as shown in FIG. 2. As will be seen, one blank plate is removed for each added plug-in board. Also to be noted is the fact that there can be any number of connectors on each side of the partition and the number on each side can be different.

Also part of carrier 20 are bracket ends 231, 232 and 230, which are used to fasten carrier 20 to computer system 100 as will be seen.

Figure 3:
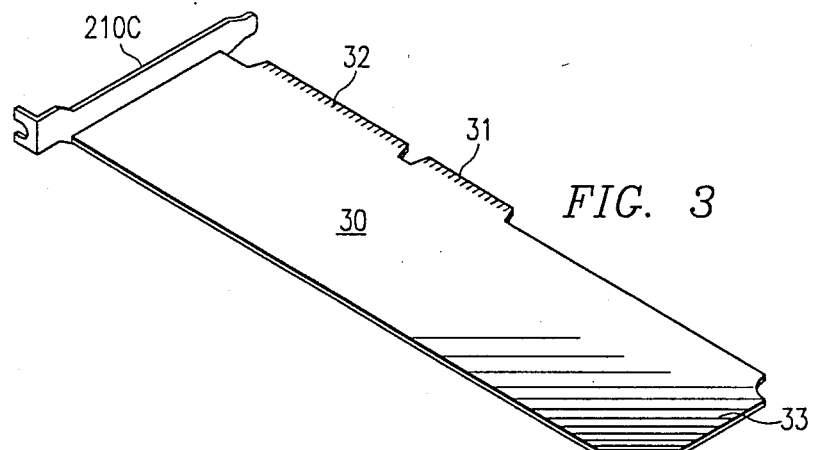
FIG. 3 shows one type of an expansion board for insertion in the carrier.

Turning now to FIG. 3, there is shown board 30 which is connected to end bracket support 210C. Board 30 has an electrical connector section 32, 31 for mating with connectors 204 and 205 of vertical board 206 of carrier 20. Board 30 also has end 33 which is not used in this embodiment for electrical connection, but is used to provide support for the forward end of board 30 when it has been plugged into system 100. Support cover plate 210C is fastened to an end of board 30.

Figure 4:
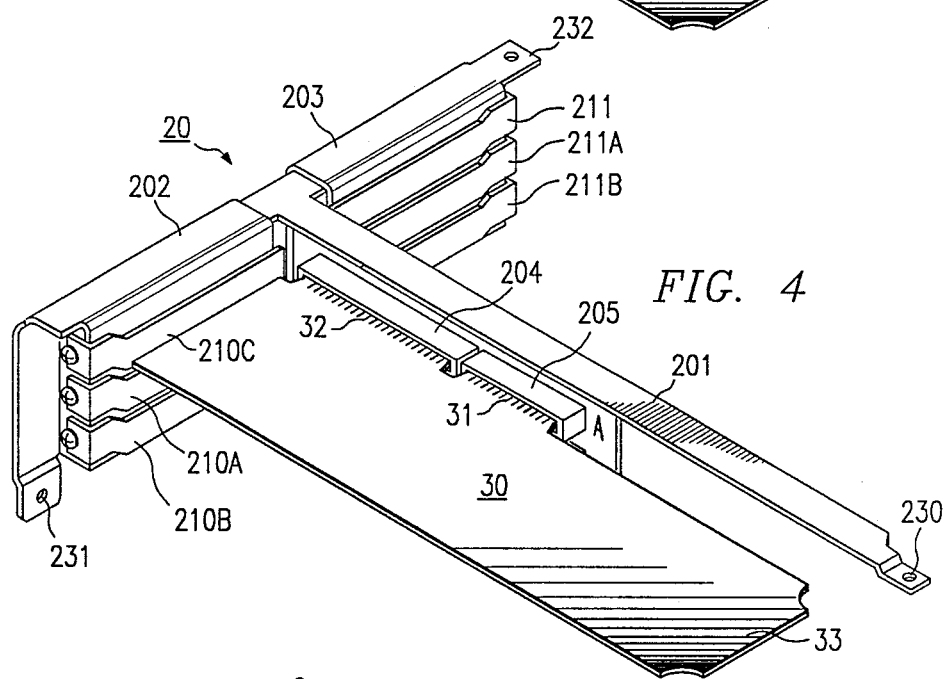
FIG. 4, shows the expansion board inserted horizontally on one side of the carrier partition.

In operation, as shown in FIG. 4, board 30 is inserted in one of the levels A, B or C of vertical board 206 via connector ends 32 and 31. Thus, connector ends 32, 31 are inserted into connector 204, 205 (or 204A, 205A or 204B, 205B). It should be noted that while two connector ends 31, 32 are shown, this could just as well be one solid connector or several connectors, as the case may be, depending upon the particular application.

FIG. 4 shows the insertion of board 30 into bracket 20 in slot A. This insertion could have just as easily been made into slots B or C. Any number of plug-in boards (up to 3 in this embodiment) can be added to carrier 20. When a plug-in board is to be added to the system, a blank plate, such as plate 210, is removed. Plate 210 is replaced by support plate 210C fastened to an end of board 30. Plates 210, therefore, selectively cover a plurality of closeable slots formed in the rear bracket 202, 203.

Figure 5:
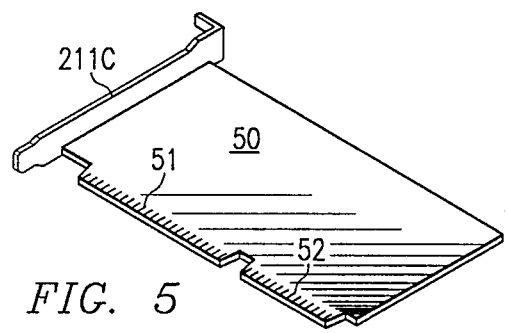
FIG. 5 shows a second type of expansion board.

In FIG. 5 there is shown board 50 which is a smaller version of board 30. Board 50 also has a terminal end, 51 and 52, for insertion into the connectors on vertical board 206. Also fastened to board 50 is support bracket 211C, which, as will be seen, will replace one of the brackets 211-211B.

Figure 6:
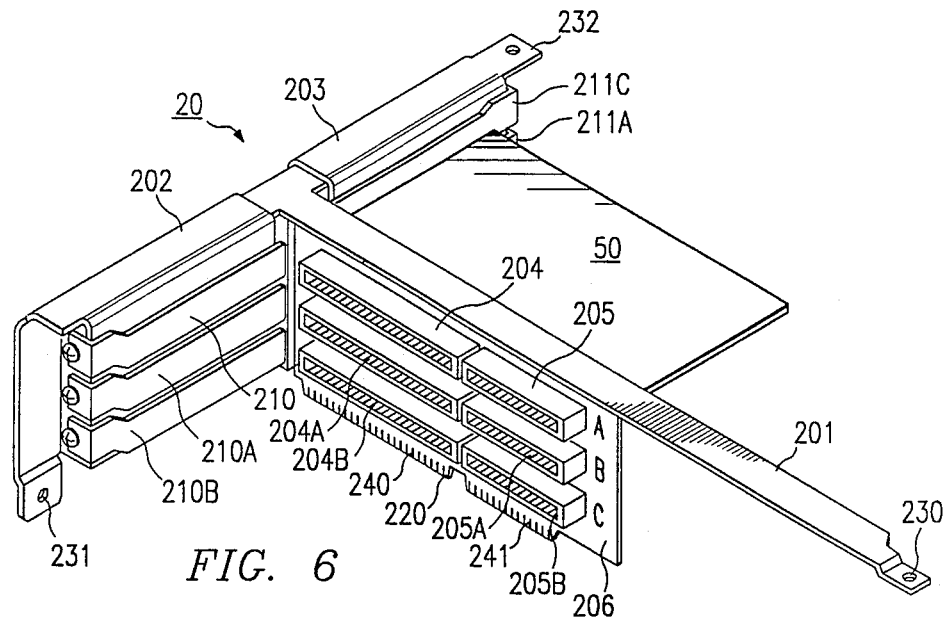
FIG. 6 shows the second type of expansion board inserted on the other side of the carrier partition.

In FIG. 6, board 50 is shown inserted into slot A of the far side of partition board 206. As shown in FIGS. 4 and 6, carrier 20 has been removed from computer system 100 for the easy insertion of the plug-in boards. The advantage of this arrangement will be discussed more fully hereinafter. Once carrier 20 is back in place, the cover (not shown) is placed back on the computer, and the computer is ready for operation.

While the connectors on the vertical partition 206 are shown unkeyed, a keying system could be easily established so that certain boards can be added only in certain locations. Also, some boards could be double so that they take up two rows. Different carriers can be provided with different keying arrangements and different numbers of main board connectors 81, 82 can be used for different carrier types. This then could allow for a wide range of options, all easily added by the untrained user.

It must also be noted that the carrier can be positioned forward/backward as shown or from side to side and can have a spur jutting out from the carrier to hold even more boards. The spur could be permanent or could be connectible to the main carrier.

Figure 7:
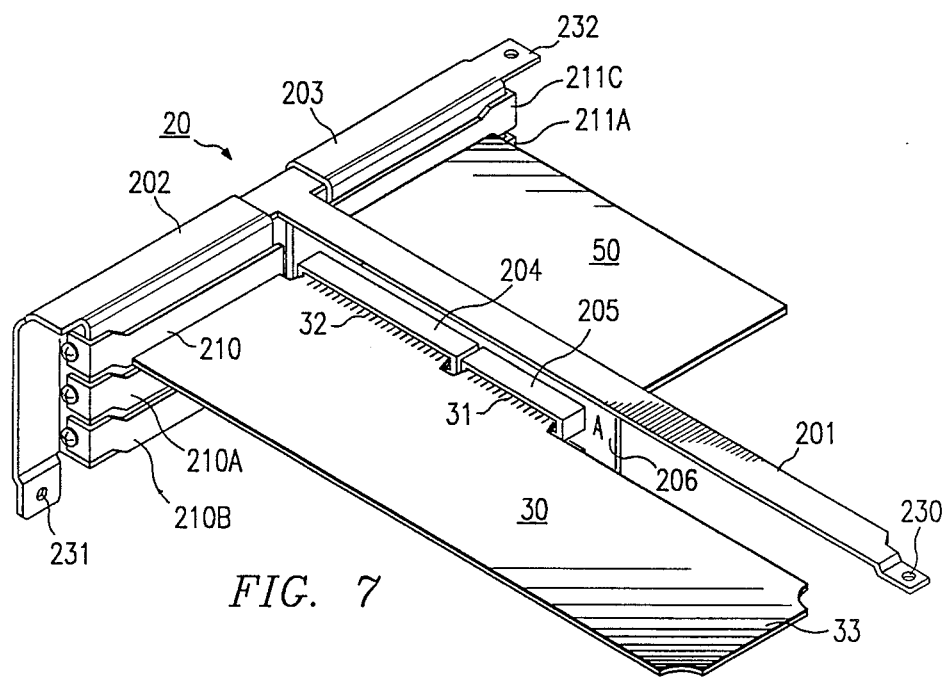
FIG. 7 shows both board types inserted on each side of the carrier partition.

Turning to FIG. 7, there is shown carrier 20 having two boards 30 and 50 installed therein. Both boards 30 and 50 are installed in upper slot A on opposite sides of partition 206. This is arbitrary, and either board can be installed in any slot chosen by the user. In fact it may be advantageous to install the board from bottom to top for easier subsequent installation of additional boards.

Figure 9:
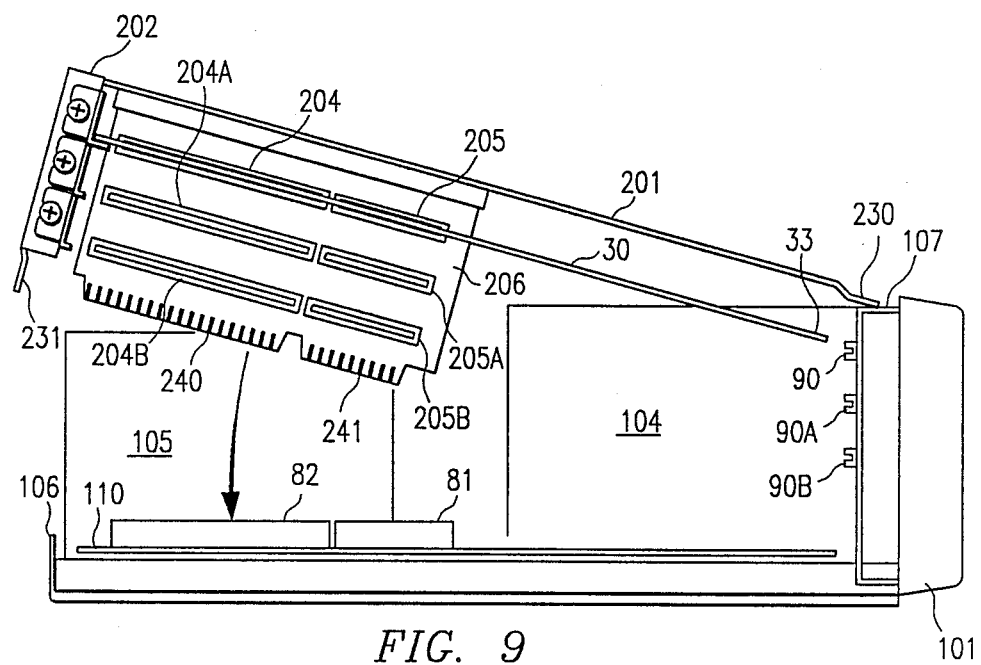
FIG. 9 shows a side view of carrier being inserted into the permanently mounted circuit board.

Once the boards are installed in carrier 20, the carrier can be installed into computer system 100, as shown in FIG. 9, by inserting connector 240, 241 into mating connector 82, 81 of electrical board 110. Once this is accomplished, top support bracket 201 is positioned such that end 230 is in contact with ledge 107 of front panel 101, and a screw or other fastener can be inserted to maintain the front end of carrier 20 in place. During insertion the leading edge 33 of board 30 is inserted into support holder 90 on the rear surface of front cover 101. By pressing carrier 20 downward, tab 231 can be brought into position next to backplate 106, and a screw or other fastening device can be used to hold the rear end of carrier 20 in position. The vertical partition connectors are electrically connected to the permanently mounted connector such that when the carrier is in position within the housing all of the mated plug-in boards are electrically operable and connected to the existing computer system. The actual internal wiring is not shown for clarity, but is straightforward and can be arranged in any pattern desirable, from universal (where only a particular type of board can be added) to very specific (where any type of board can be added).

Continuing with FIG. 8, it can be easily visualized that if carrier 20 were to be positioned permanently in place within computer system 100, then board 30 on the near side of carrier 20 could be fairly easily replaced or added as necessary. However, it is also easy to visualize that it would be impossible to remove or add board 50 on the far side of carrier 20 since the board would bump into power supply 105, and thus, be unable to be disconnected. It is the ability to remove the entire carrier 20 from the computer system which allows for the installation or removal of a large number of extra boards, all by people who are relatively untrained technically. This is accomplished without disconnecting any system components other than the carrier.

What is claimed is:

1. In an electronic housing having a main circuit board, the method of adding add-on boards to the main circuit board when the main circuit board has established thereon an electrical connector, said method comprising the steps of:

plugging into said board connector a connector support board, said support board being positioned perpendicular to the main circuit board, said support board having a plurality of connectors thereon;

supporting a rearward edge of said support board by a rearward support bracket connectable with a back edge of said housing, said bracket having a front extending support extending for support to a front edge of said housing;

inserting into said housing one or more of said add-on boards, in a plane parallel with the plane of the main circuit board; and positioning an electrical connector edge of each of said inserted add-on boards into a respective one of said electrical connectors of said support board.

2. The method of claim 1 further comprising the step of inserting a leading edge of certain of said inserted add-on boards into a front edge support positioned in conjunction with said front edge of said housing.

3. The method of claim 2 further comprising the steps of removing all said add-on boards from said housing, said steps including the steps of:

disengaging said rearward support bracket and said front extending support from said housing;

disengaging said leading edge of said certain inserted add-on board from said front edge support; and disengaging said support board from said board connector.

4. The method of removing add-on boards from an electronic component housing wherein the housing contains at least one main circuit board having established therein a board connector, and wherein plugged into said board connector is a vertical support, said vertical support being positioned perpendicular to said established board connector and also perpendicular to the front and back edges of said housing, said vertical support having a plurality of connectors all parallel to the plane of said established board, the rearward edge of said vertical support being support by a rearward frame connectable with said back edge, said frame having a portion extending for support to said front edge of said housing, certain of said boards having forward portions supported by brackets on said front edge, said method comprising the steps of:

disengaging said rearward frame and said extending portion from said housing;

disengaging said forward portions of said certain ones of said add-on boards from said brackets on said front edge; and disengaging said vertical support from said board connector thereby severing all electrical connection between said add-on boards and said board connector.

5. A carrier for controlling the addition and removal of add-on boards in a housing unit, said carrier comprising:

a rear section for forming a rear cover of said housing;

a support section perpendicular to said rear section and extending to a front cover of said housing;

a plurality of closable slots positioned in said rear section, each said slot adapted to receive one of the add-on boards; and a grouping of electrical edgewise connectors supported by said rear section and said support section, said connectors having their longitudinal axis along said support section and adapted to receive in mated relationship electrical connectors positioned along a side edge of the add-on boards received within one of said slots.

6. The carrier of claim 5 wherein said housing contains a substantially permanent circuit board mounted within said housing substantially horizontal with a base of said housing, said permanent board having connected thereto an edgewise electrical connector extending in a direction across said board from back to front, said edgewise connector mounted substantially beneath said support section, and wherein said grouping of edgewise connectors are coupled to said support section, said support section having a connector edge adapted to mate with said permanent circuit board edgewise connector when said rear section is positioned to form said rear cover of said housing and when said support section is mated with said front cover.

7. The carrier of claim 6 wherein said slots are positioned in said rear section one over the other.

8. The carrier of claim 6 wherein said support section intersects with said rear section to form a left section and a right section and wherein said slots are arranged in said rear cover in two vertical columns, one column being in said left section and one column being in said right section, and wherein the add-on boards may be added via any of said slots.

9. The carrier of claim 8 wherein said grouping of connectors is arranged such that said connectors are adapted to receive electrical connectors positioned along a side edge of the add-on boards received via any of said slots.

10. The carrier of claim 9 wherein said slots are adapted to receive add-on boards having a full length whereby they extend substantially from said rear cover to said front cover and also having a half-length whereby the add-on boards extend from said rear cover approximately one half the distance to said front cover; and said front cover having front supports thereon, one support for each said slot, and wherein the leading edges of the full length add-on boards are adapted to be supported by said front supports.

11. The carrier of claim 9 wherein said slots and the individual connectors of said connector grouping are adapted to support all the add-on boards such that all of the received add-on boards are removable from said housing as a unit by electrically unplugging said carrier from said edgewise electrical connector of said permanent board.

12. A plug-in board carrier for use in an electrical system where there is at least one internal connector adapted for receiving said carrier, said carrier adapted to receive plug-in boards horizontally stacked one above the other on both sides of a vertical partition, said carrier comprising:

a T bracket for fastening said carrier to an electrical system housing of the electrical system, said T bracket comprising a leg portion and a top portion, an end of said top portion of said T bracket adapted to fasten to a back surface of said housing; and means, including said top portion and said leg portion of said T bracket for suspending said vertical partition downward within said electrical system and in a plane perpendicular to a bottom plane of said electrical system housing, said vertical partition comprising:

at least one edge electrical connector adapted for mating with said internal connector;

a plurality of electrical connectors spaced on both sides of said vertical partition and adapted to receive, in electrical mating relationship, the plug-in boards; and circuitry for electrically interconnecting said plurality of electrical connectors with said edge connector so that said carrier can be removed from said electrical system while several of the plug-in boards remain in mated relationship with said partition on both sides of said partition.

13. The carrier set forth in claim 12, wherein said top portion of said T bracket includes a downwardly displaced section for supporting an edge of each of the plug-in boards.

14. The carrier set forth in claim 13 wherein said downwardly displaced section includes means for alternately supporting an edge of each of the plug-in boards or a blank covering plate.

15. The carrier set forth in claim 12 wherein said vertical partition connectors on each side of said partition are mounted one above the other with their longitudinal axis parallel to said bottom plane of said electrical system housing.

16. The carrier set forth in claim 12 wherein said vertical partition is positioned perpendicular to both said back surface of said housing and with said front plate of said housing when said edge connector is mated with said internal connector.

* * * * *